United States Patent [19]

Kumano et al.

[11] Patent Number: 5,698,887

[45] Date of Patent: Dec. 16, 1997

[54] SEMICONDUCTOR PROTECTION CIRCUIT

[75] Inventors: Hiroshi Kumano; Kazufumi Mimoto; Eiichi Sakao, all of Kyoto; Fumiaki Shigeoka, Kitakyushu, all of Japan

[73] Assignee: Rohm Co., Ltd., Kyoto, Japan

[21] Appl. No.: 638,927

[22] Filed: Apr. 25, 1996

[30] Foreign Application Priority Data

Apr. 26, 1995 [JP] Japan ................................. 7-102276
Aug. 22, 1995 [JP] Japan ................................. 7-213675

[51] Int. Cl.[6] ..................................... H01L 31/058
[52] U.S. Cl. ..................... 257/467; 257/469; 257/529; 257/568
[58] Field of Search ........................ 257/362, 529, 257/363, 568, 467, 469

[56] References Cited

U.S. PATENT DOCUMENTS 4,716,302  12/1987  Flannagan et al. ............... 307/200 B
5,526,317  6/1996   McClure ........................... 365/225.7
5,625,521  4/1997   Luu ................................. 361/111

Primary Examiner—Ngân V. Ngô
Attorney, Agent, or Firm—Nikaido, Marmelstein, Murray & Oram LLP

[57] ABSTRACT

In a semiconductor protection circuit, a current fuse and a transistor are connected in series between a power supply terminal and a ground. A bias circuit is provided between the base and the emitter of the transistor. The bias circuit applies between the base and the emitter of the transistor a constant bias voltage that is lower than a normal environment temperature forward voltage of a p-n junction between the transistor's base and emitter. When a load connected to the other terminal of the current fuse is overheated, the forward voltage of the p-n junction drops, and the transistor is turned on.

20 Claims, 12 Drawing Sheets

SEMICONDUCTOR PROTECTION CIRCUIT

BACKGROUND OF THE INVENTION

1. Field of the Invention

The present invention relates to a semiconductor protection circuit for protecting semiconductors against overheating and overcurrent.

2. Description of the Prior Art

An electronic component such as a semiconductor device may be led to deterioration in performance or to destruction through a misuse under unpermitted conditions, or through changes in an operation environment, etc. In an integrated circuit, deterioration or destruction of part of the circuit devices may cause the whole circuit to lose its functions, and to prevent this, a protection circuit is incorporated therein.

Figure 1:
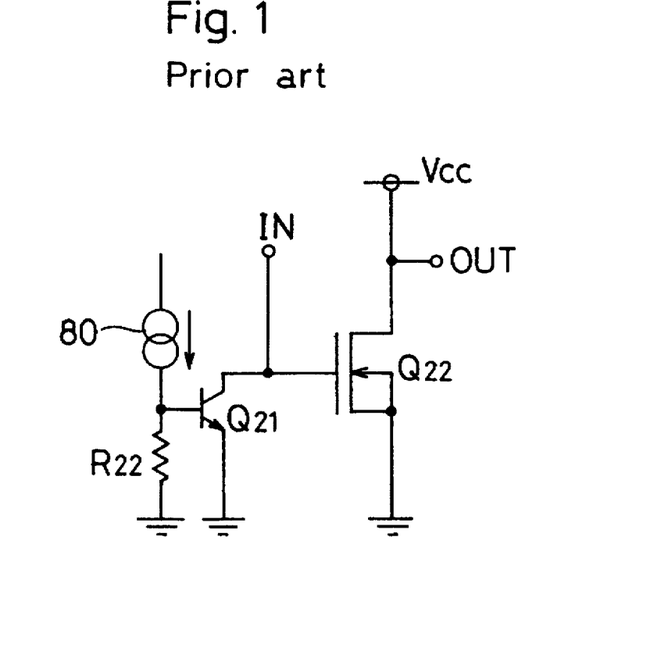
FIG. 1 is an equivalent circuit diagram showing a conventional overheat protection circuit.

Conventionally, a circuit as shown FIG. 1 has been used as an overheat protection circuit against overheat. In FIG. 1, $Q_{22}$ represents a metal oxide semiconductor field effect transistor (hereinafter, referred to as "MOSFET"), a transistor $Q_{21}$ being connected between the gate and the source of the MOSFET $Q_{22}$ for protecting the MOSFET from heat, a resistor $R_{22}$ and a constant current source 80 being connected to the base of the transistor $Q_{21}$. At a normal environment temperature, since a current does not flow into the transistor $Q_{21}$ but into the resistor $R_{22}$, the transistor $Q_{22}$ is maintained in a cutoff state. Accordingly, a voltage from a terminal IN is applied to the gate of the MOSFET $Q_{22}$ so that the MOSFET $Q_{22}$ is driven.

In contrast, when a fault occurs in a load, raising the temperature, the temperature of the transistor $Q_{21}$, which is located near the load, rises accordingly. As the temperature of the transistor $Q_{21}$ rises, the forward voltage (that is, a threshold voltage) of the p-n junction between the transistor's base and emitter drops. The rate of a drop in the forward voltage with respect to a rise in temperature is around $-2$ mV/°C. Consequently, a current starts flowing into the transistor $Q_{21}$, and the collector-emitter voltage of the transistor $Q_{21}$ drops abruptly. As a result, the gate voltage of the MOSFET $Q_{22}$ drops, cutting the supply of voltage from the terminal IN to the MOSFET $Q_{22}$. The MOSFET $Q_{22}$ is then unable to operate. Thus, it is possible to protect electronic components from destruction that may occur if an overheated load is kept operating. In this circuit, when overheat of the load disappears and the temperature returns to a normal condition, the forward voltage of the p-n junction of the transistor $Q_{21}$ also returns to a normal value, restoring the transistor $Q_{21}$ to a cutoff state and restoring the MOSFET $Q_{22}$ to normal operation.

As described above, a conventional overheat protection circuit utilizes a drop in a collector-emitter voltage according to a temperature characteristic of the transistor $Q_{21}$ to disable the transistor $Q_{22}$ and thereby cutting an output supply to a load. For this reason, in order to prevent the transistor $Q_{21}$ from accumulating heat, it is necessary to use a transistor designed for use under saturation. A conventional circuit is therefore defective because it necessitates special designing, imposes restrictions, and increases costs.

Moreover, when a condition of the load recovers from overheat to a normal temperature, the transistor $Q_{21}$ returns to a cutoff state and restarts supplying the output to the load, only to cause overheat again if a cause of the overheat is such an fault in the load that is related to a supply of power. A conventional circuit is defective because it destroys a load in such a case.

On the other hand, it may be possible to insert a thermal fuse in the output stage of the circuit in order to cut the supply of power by disconnecting the circuit in the event of overheat. A thermal fuse, however, costs 10 to 20 times more than a normal current fuse. Therefore, this method is defective because it increases costs. Further, in a soldering process of circuit boards, where the temperature reaches as high as 230° C., a thermal fuse that blows at 120° C., for example, will be exposed to a temperature higher than 120° C., thereby suffering deterioration in characteristics or meltdown. Therefore this method is also defective because it does not allow dip-soldering.

Further, to realize a protection against not only overheat but also overcurrent, an overcurrent protection circuit has to be installed separately in addition to an overheat protection circuit. This further increases costs.

SUMMARY OF THE INVENTION

It is an object of the present invention to provide a low-cost semiconductor protection circuit that completely cuts a supply of power to the load, in the event of overheat in the load, in order to protect the load, and that cuts the supply of power in the event of overcurrent as well.

A semiconductor protection circuit according to the present invention is provided with a power supply terminal, a current fuse of which a terminal is connected to the power supply terminal, a transistor connected between the other terminal of the current fuse and a ground, an output terminal connected to a connection between the other terminal of the current fuse and the transistor, and a bias circuit to apply a constant bias voltage between a base and an emitter of the transistor, said constant bias voltage being lower than a normal environment temperature forward voltage of a p-n junction between said base and said emitter.

According to the present invention, a current fuse and a transistor are connected in series, and a bias voltage lower than a normal environment temperature forward voltage of a p-n junction is applied between the base and the emitter. Since a base-emitter forward voltage of a transistor inherently varies according to the temperature, the transistor does not operate in the normal environment temperature, allowing an output voltage obtained from the power supply terminal to be supplied to a load, but, as the temperature rises, the base-emitter forward voltage drops until it at last becomes lower than the bias voltage, the transistor thus being turned on to supply a current to the current fuse, which then blows and cuts the supply of power to the load.

The temperature at which said transistor is turned on to blow the current fuse, can be freely adjusted by varying the bias voltage. For example, it is known that the forward voltage of a p-n junction in silicon diodes is supposed to have a constant value $V_f$ within the range from 550 to 650 mV, and that it decreases approximately 2 mV as the temperature rises 1° C. This leads to that, if the total number of p-n junctions in the transistor (between the base and the emitter) and in the diodes that are connected serially to the emitter of the transistor is n, the total forward voltage decreases 2n mV per 1° C. Accordingly, if the bias voltage is set to a voltage $n(V_f-2\Delta T)$ mV, which is $2n \cdot \Delta T$ mV lower than $n \cdot V_f$, where $2n \cdot \Delta T$ is obtained by multiplying $2n$ mV by a difference $\Delta T$ between a specified temperature and a normal environment temperature, the current fuse will blow when the temperature reaches a temperature $\Delta T$°C. higher than the normal environment temperature.

According to the present invention, since a current fuse is connected in series between a voltage supply terminal and an output terminal, a supply of power to a load is immediately cut, by setting in advance the current at which the current fuse blows to a value 4 to 10 times larger than the maximum current the load consumes, when, not a fault due to overheat, but an overcurrent due to a component failure or a short circuit occurs. Incidentally, by adjusting an amplification factor of a transistor or by connecting transistors in the Darlington fashion, a current at which the current fuse is blown by the above-described operation of a transistor as a result of an overheat can be easily adapted to a current at which the current fuse blows as a result of an overcurrent.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

With reference to the drawings, a semiconductor protection circuit according to the present invention will be described.

Figure 2:
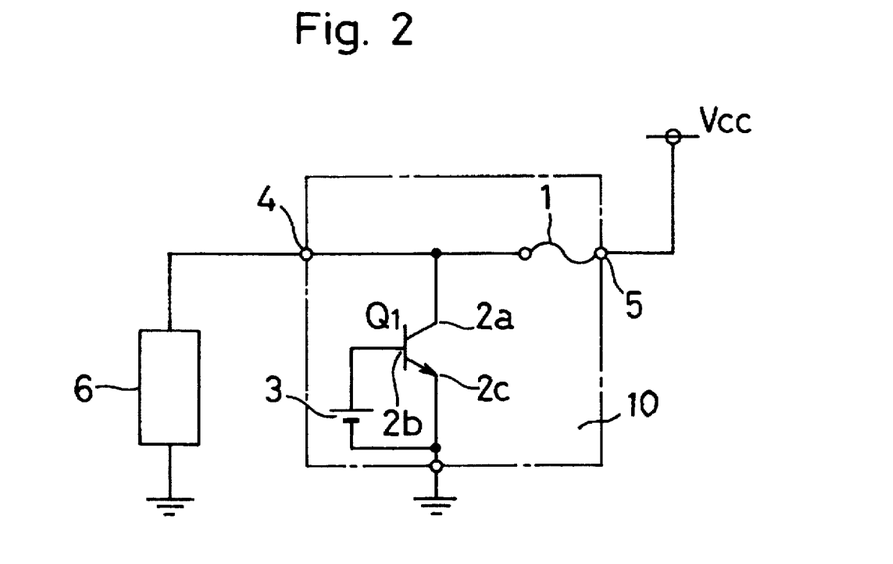
FIG. 2 is an equivalent circuit diagram showing a first embodiment of a semiconductor protection circuit according to the present invention.

FIG. 2 is an equivalent circuit diagram showing a basic construction (a first embodiment) of a semiconductor protection circuit according to the present invention. In a semiconductor protection circuit of the present invention, a current fuse 1 and a transistor $Q_1$, between its collector 2a and emitter 2c, are connected in series between a power supply terminal 5 and a ground. A power supply terminal 5 is connected to a power source voltage $V_{cc}$ which is supplied to a load 6. A connection between the current fuse 1 and the collector 2a of the transistor $Q_1$ is connected to an output terminal 4. The load 6 is connected between the output terminal 4 and the ground. A power source 3 is connected between a base 2b and the emitter 2c of the transistor $Q_1$ to supply thereto a voltage (0.3 to 0.5 V, for example) slightly lower than a normal environment temperature forward voltage between the transistor's base and emitter. In FIG. 2, the area between the output terminal 4 and power supply terminal 5, enclosed with long-and-short-dash lines, shows a basic construction of a semiconductor protection circuit 10 according to the present invention.

The power source 3 is not necessarily be provided as a separate source if a constant voltage that is to be applied between the base and the emitter is generated from the power source voltage $V_{cc}$ by a bias circuit. In the present invention, therefore, a bias circuit is regarded as including such that comprises only a power source 3. It is also to be noted that, as FIG. 2 shows only a basic construction, a resistor or other may be inserted between the connection from the emitter 2c to the power source 3 and the Ground, for example.

Next, the working of a semiconductor protection circuit of the present invention is described. At the normal environment temperature, since a bias voltage (0.4 V, for example) applied between the base 2b and the emitter 2c of the transistor $Q_1$ is lower than a normal environment temperature forward voltage (0.6 V, for example) between the base and the emitter of the transistor $Q_1$, the transistor $Q_1$ remains off, that is, open. Thus, a voltage as it is at the power supply terminal 5 is directed through the fuse 1 to the load 6.

Figure 3:
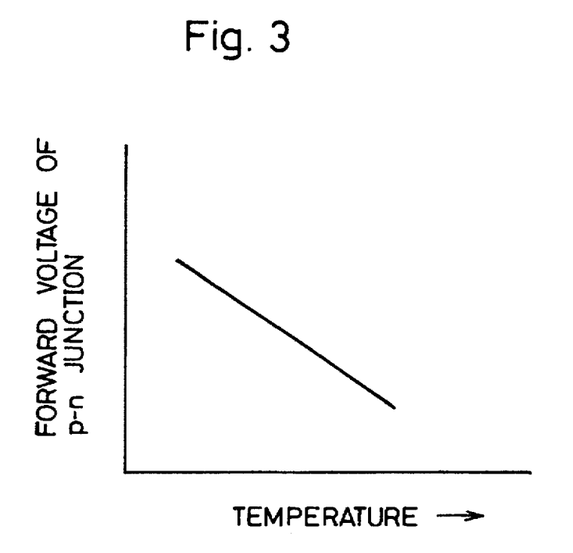
FIG. 3 is a diagram showing a variation in the forward voltage of a p-n junction according to temperature.

In contrast, as the temperature of the load 6 or its environment rises, the forward voltage (threshold voltage) of a p-n junction between the base and the emitter of the transistor $Q_1$ drops. As shown in FIG. 3, the forward voltage of a p-n junction shows a decrease inversely proportional to the temperature (at an approximate rate of −2 mV per a temperature rise of 1° C.). As a result, when the temperature rises up to around 125° C., for example, the base-emitter forward voltage of the transistor $Q_1$ drops to around 0.38 V while the base-emitter bias voltage remains constant around 0.4 V, the transistor $Q_1$ being thereby turned on. Thus, a current flows through the transistor $Q_1$, blowing the fuse. The amount of a current fed into the transistor $Q_1$ can be freely specified by adjusting the area or the amplification factor $h_{FE}$ of the transistor $Q_1$, or by altering the manner of connection, though it is, usually set to a value 4 to 10 times Greater than a rated current of the fuse. Consequently, when the temperature of the load 6 rises because of a fault in it, or when the ambient temperature rises so much that the load 6 or other circuits around it are likely to be damaged, it is possible to cut the supply of power immediately, thereby protecting the load 6 against destruction due to the fault.

Utilizing a variation in the forward voltage of a p-n junction in a transistor according to the temperature, a semiconductor protection circuit of the present invention cuts, in the event of a fault in a load etc., a supply of power to the load by blowing a current fuse, in order to protect the load without fail. It also protects the power-supply side, because it does not leave a short circuit current to flow through a transistor as a conventional circuit does.

Further, a semiconductor protecting circuit of the present invention, being provided with a current fuse 1 inserted in series between a power supply terminal 5 and a load 6, cuts the supply of power by blowing the fuse 1 also when an overcurrent occurs as a result of a fault in a load 6 before the temperature rises. It therefore serves as an overcurrent protection circuit as well, without necessitating a separate circuit for protection against overcurrent.

On the other hand, after a fuse has been blown as a result of overheat or overcurrent, the original conditions can be restored by removing causes for s fault and then replacing a semiconductor protection circuit. Thus, since the supply of power is restarted after examination and removal of the causes of a fault, a load is protected against similar faults that might be repeated otherwise.

Next, descriptions will be given with respect to other embodiments.

Figure 4:
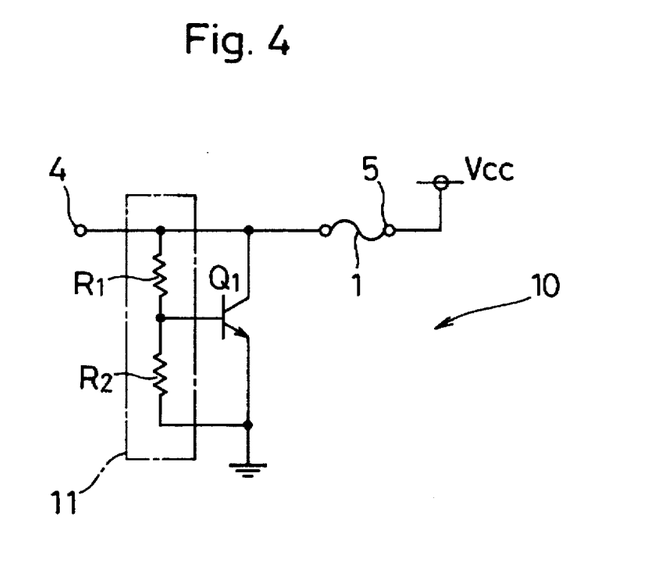
FIG. 4 is an equivalent circuit diagram showing a second embodiment of a semiconductor protection circuit according to the present invention.

FIG. 4 is an equivalent circuit diagram showing a second embodiment of a semiconductor protection circuit of the present invention. In this embodiment, where the bias circuit 11 is composed of resistors $R_1$ and $R_2$, the voltage obtained by dividing a supply voltage $V_{cc}$ with the resistors $R_1$ and $R_2$ is applied as a base-emitter bias voltage to the transistor $Q_1$. If a resistance ratio of the resistor $R_1$ to the resistor $R_2$ is so determined that a voltage appearing across the resistor $R_2$ will be 0.2 V lower, for example, than the normal environment temperature forward voltage between the transistor $Q_1$'s base and emitter, the transistor $Q_1$, which is off at the normal environment temperature, will be turned on when the temperature rises up to around 125° C., allowing a current to flow into the transistor $Q_1$. In other words, the base-emitter bias voltage for the transistor $Q_1$ is determined by the resistors $R_1$ and $R_2$ in this embodiment, and, while the power source voltage $V_{cc}$ and the resistances of the resistors $R_1$ and $R_2$ are not affected so much by the temperature, the base-emitter forward voltage of the transistor $Q_1$ varies as the temperature rises, until the transistor $Q_1$ at last starts to conduct a current, blowing the fuse 1 and thus cutting the supply of output to the load.

The bias voltage, resulting from voltage division by resistors, does not necessarily use as its source the voltage between the power source voltage $V_{cc}$ and the ground. It is also possible to use a constant voltage obtained from a constant current circuit or a constant voltage circuit. By dividing the voltage with resistors into a required voltage, a desired bias voltage can be obtained.

In this embodiment where the operation ambient temperature is determined by the ratio of $R_1$ to $R_2$, only relative deviations are to be evaluated in a production process. In this case, absolute deviations do not affect the circuit performance.

Figure 5:
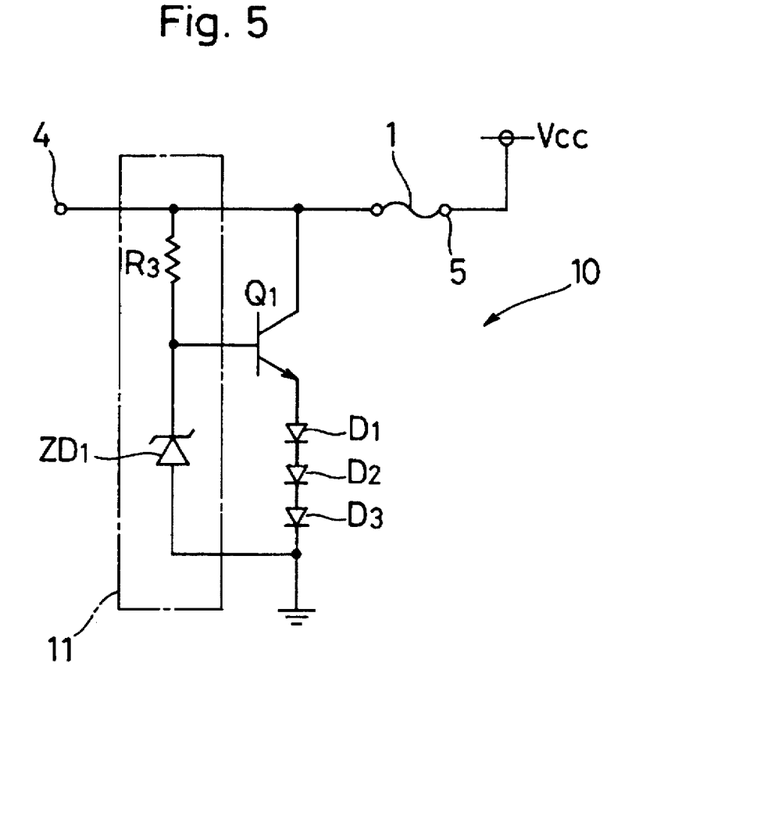
FIG. 5 is an equivalent circuit diagram showing a third embodiment of a semiconductor protection circuit according to the present invention.

FIG. 5 is an equivalent circuit diagram showing a third embodiment of a semiconductor protection circuit of the present invention. In this embodiment 2, the bias circuit 11 is composed of a resistor $R_3$ and a Zener diode $ZD_1$. A Zener voltage of the Zener diode $ZD_1$ is utilized as a base-emitter bias voltage for the transistor $Q_1$. Since the base-emitter forward voltage of the transistor $Q_1$ is around 0.6 V and it is not possible to raise this voltage, a number n of forward diodes $D_1, D_2, \ldots D_n$ are connected in series between the emitter of the transistor $Q_1$ and the ground. In this case, if the circuit is to be actuated at 125° C., for example, the total forward voltage should be a voltage which is by {(Operation Temperature)−(Normal Environment Temperature)}·2(n+1) =(125−25)·2·(n+1)=(n+1)·200 (mV) higher than the Zener voltage, which is around 5V and used as a bias voltage in the normal environment temperature. In other words, since the forward voltage of one p-n junction is around 0.6 V, the number n can be determined by solving 0.6(n+1)−5=0.002 (n−1)ΔT (ΔT represents a difference between a normal environment temperature and a temperature at which the fuse is to be blown). Incidentally, the forward voltage of the diodes may be determined freely within the range from 0.55 to 0.65 V depending on how the circuit is designed.

Figure 6:
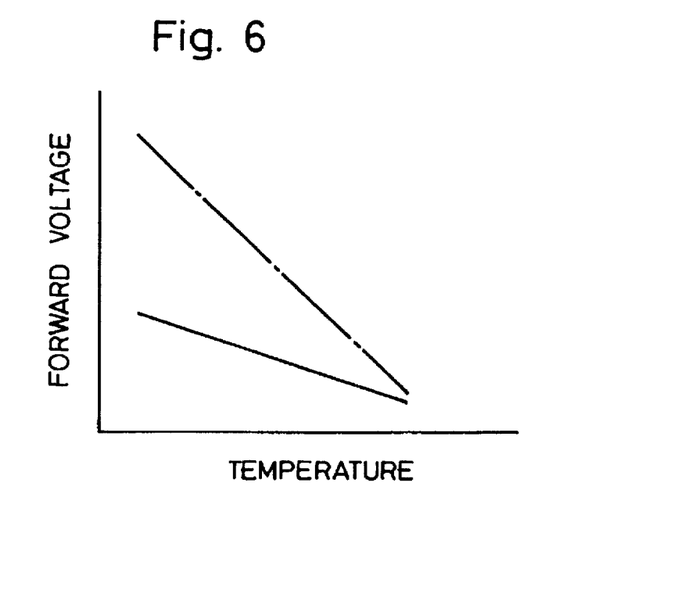
FIG. 6 is a diagram showing a characteristic of the third embodiment.

In this embodiment, where a number n of diodes $D_1, D_2, \ldots D_n$, each having a forward voltage and being arranged in the same direction, are connected in series, the total forward voltage varies (n+1) times more per unit temperature variation. This leads to an enhancement of sensitivity, as shown with a long-and-short-dash line in FIG. 6, in contrast to the case where only one diode is used, shown with a solid line in the same drawing.

The Zener diode $ZD_1$, which is used for setting a bias voltage, may be replaced with a resistor, so that the bias voltage will be obtained by voltage division by resistors, as in the second embodiment. However, a Zener diode is preferable for the purpose of setting a bias voltage, because it is capable of constantly applying a stable voltage determined by its Zener voltage between the transistor $Q_1$'s base and emitter, independent of the resistor $R_3$, and because it eases the flow of current in the event of overheat, for a Zener voltage of a Zener diode rises according to a temperature rise, at a rate of around +3 mV/°C.

Figure 7:
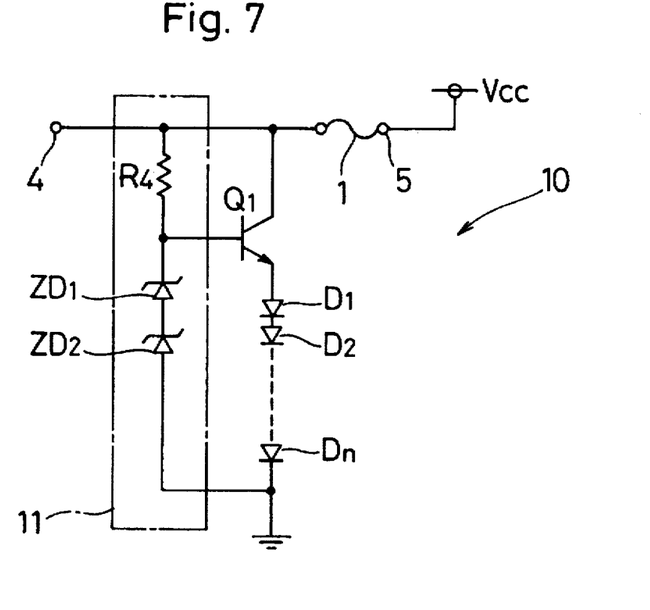
FIG. 7 is an equivalent circuit diagram showing a fourth embodiment of a semiconductor protection circuit according to the present invention.

FIG. 7 is an equivalent circuit diagram showing a fourth embodiment of a semiconductor protection circuit of the present invention. In this embodiment, where the bias circuit 11 is composed of a resistor $R_4$ and two Zener diodes $ZD_1$ and $ZD_2$, the base-emitter bias voltage for the transistor $Q_1$ originates from the Zener voltages of the Zener diodes $ZD_1$ and $ZD_2$ connected in series.

In this embodiment, the base-emitter bias voltage for the transistor $Q_1$ increases up to around 10 V, that is, twice as high as in the third embodiment. Accordingly, it is necessary to approximately double the number of diodes connected in series to the emitter of the transistor $Q_1$. This embodiment, however, not only has an advantage of preventing $R_4$ from being maximized in size, but also further enhances sensitivity to temperature as a result of the number of diodes being approximately doubled.

Figure 8:
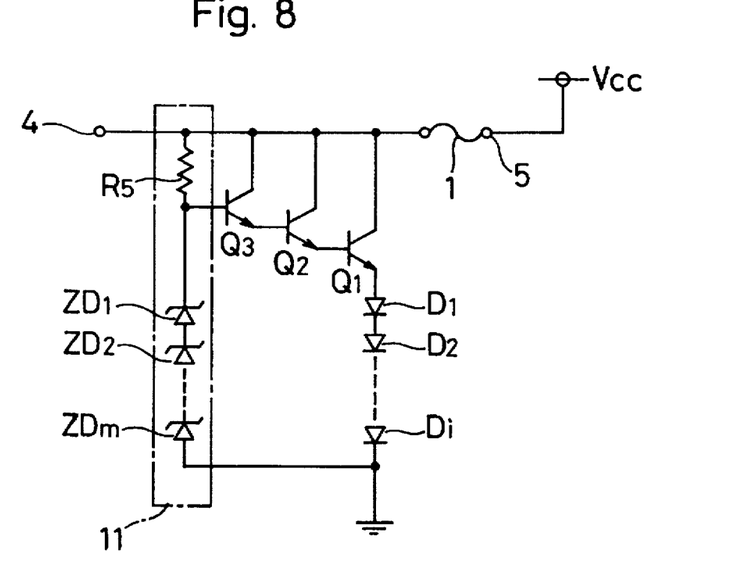
FIG. 8 is an equivalent circuit diagram showing a fifth embodiment of a semiconductor protection circuit according to the present invention.

FIG. 8 is an equivalent circuit diagram showing a fifth embodiment of a semiconductor protection circuit of the present invention. In this embodiment, three transistors $Q_1$, $Q_2$ and $Q_3$ are connected in the Darlington fashion so that amplification is performed in multiple stages by a plurality of transistors, allowing a larger amount of current to flow when the three transistors $Q_1$, $Q_2$ and $Q_3$ are turned on. Consequently, even if a load requires a large amount of current, that is, if the current fuse 1 needs to be one for a high current rate, the current fuse can be blown accurately.

In the embodiment, a number m of Zener diodes $ZD_1$, $ZD_2, \ldots ZD_m$ are used to raise a voltage applied as a bias voltage between the base of the transistor $Q_3$ and the diode $D_i$ that is the final one of the forward diodes $D_1, \ldots D_i$ connected in series to the emitter of the output stage transistor $Q_1$ in a Darlington connection. However, the use of a plurality of Zener diodes has no particular relation with the use of transistors connected in the Darlington fashion, each being adopted because of its own merits. According as a number m of Zener diodes are used, it is necessary to connect a number i of diodes in series to the emitter in order to obtain a higher forward voltage according to a higher bias voltage, and this leads to an enhancement of the sensitivity to temperature, as described above.

This embodiment, where a plurality of transistors are connected in the Darlington fashion, is effective, for example, when the output terminal 4 needs to have a large current capacity because a load requires a large amount of current, or when a large amplification factor $h_{FE}$ is required relative to a consumed current.

Figure 9:
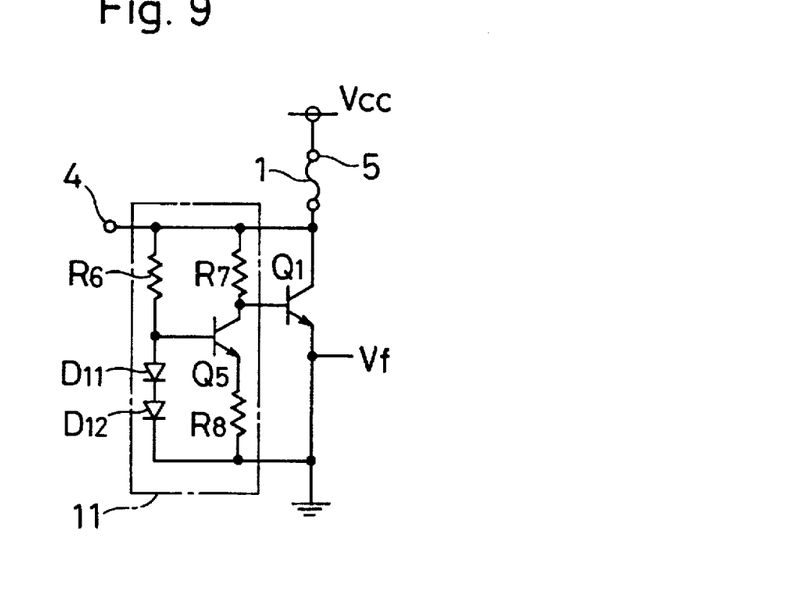
FIG. 9 is an equivalent circuit diagram showing a sixth embodiment of a semiconductor protection circuit according to the present invention.

FIG. 9 is an equivalent circuit diagram showing a sixth embodiment of a semiconductor protection circuit of the present invention. In this embodiment, where the bias circuit 11 is composed of a current mirror circuit comprising two diodes $D_{11}$ and $D_{12}$, a transistor $Q_5$, a resistor $R_8$, and resistors $R_6$ and $R_7$ connected to the previously mentioned components, the output stage transistor $Q_5$ of the current mirror circuit applies a bias voltage to the base of said output transistor $Q_1$. The remaining part of the circuit is constructed as in the aforementioned embodiments.

In this embodiment, the bias circuit uses an output stage transistor of an incorporated current mirror circuit in order to apply a bias voltage to the output transistor $Q_1$. It is possible to fine-tune the amount of, and therefore, to stabilize the supply of a current supplied to the base of the transistor $Q_1$ or the collector of the transistor $Q_5$. In addition, since the operation temperature can be determined by the resistance ratio $R_7/R_8$, absolute deviations encountered in a production process have no practical effects, and therefore, only relative deviations need to be evaluated there.

Although this embodiment uses a current mirror circuit comprising diodes and a transistor, a typical current mirror circuit comprising two transistors can be used for the same purpose. Moreover, as FIG. 9 shows only principal components, it is desirable, in order to obtain a more stable bias voltage, to supply to said current mirror circuit such a constant voltage as is generated by a common constant current circuit combined with a Zener diode, a band-gap circuit, a Schottky diode or other that receives a constant current therefrom.

Figure 10:
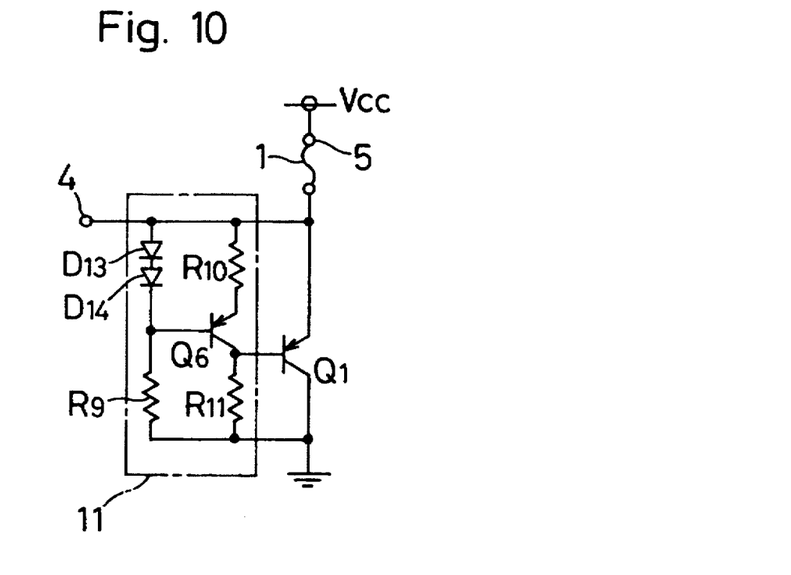
FIG. 10 is an equivalent circuit diagram showing a seventh embodiment Of a semiconductor protection circuit according to the present invention.
Figure 11:
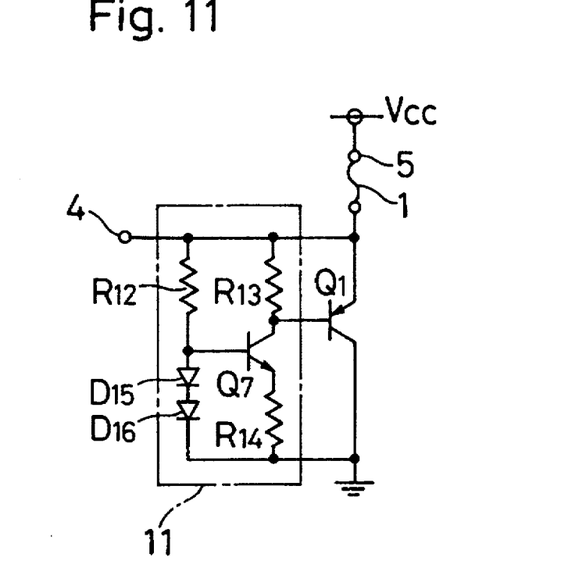
FIG. 11 is an equivalent circuit diagram showing a eighth embodiment of a semiconductor protection circuit according to the present invention.
Figure 12:
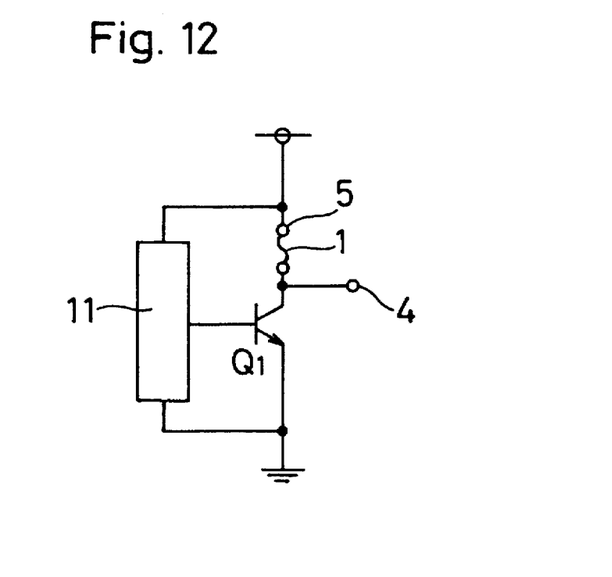
FIG. 12 is an equivalent circuit diagram showing a ninth embodiment of a semiconductor protection circuit according to the present invention.

FIGS. 10, 11 and 12 are equivalent circuit diagrams showing seventh, eighth and ninth embodiments of a semiconductor protection circuit of the present invention. In these embodiments, a pnp transistor is used as the transistor $Q_1$ that serves as an ambient temperature sensor, and the bias circuit 11 is composed of a current mirror circuit as in the fifth embodiment. FIG. 10 shows an embodiment where a pnp transistor is used as the transistor $Q_6$ of the current mirror circuit. FIG. 11 shows an embodiment where an npn transistor is used as the transistor $Q_7$ of the current mirror circuit.

In these embodiments, the transistor $Q_1$ connected in series to the current fuse 1 has its emitter connected to the current fuse 1 and its collector connected to a ground. In FIG. 10, a voltage obtained by subtracting a voltage of the resistor $R_{11}$ from the power voltage $V_{cc}$ is applied between the emitter and the base of the transistor $Q_1$ as a bias voltage. In FIG. 11, a voltage generated at the resistor $R_{13}$ is the bias voltage.

Use of a pnp transistor in these embodiments has an advantage of reducing power consumption.

In the embodiments described above, a current fuse 1 is inserted between a power supply terminal 5 and the power supply side of a bias circuit 11. This construction is preferable because, when the current fuse 1 blows, power is no more supplied to the bias circuit 11, either. However, a semiconductor protection circuit of the present invention is so designed from the beginning that, even if a voltage is applied to the bias circuit 11, the transistor $Q_1$ does not operate under normal conditions. Accordingly, even if a voltage is kept applied to the bias circuit after the current fuse has been blown, substantially no current flows, and thus a further fault is prevented. Therefore, as shown in FIG. 12, the current fuse 1 may be connected between the power supply side of the bias circuit 11 and the collector of the transistor $Q_1$. Even in this case, the output terminal 4 is connected to a connection between the current fuse 1 and the transistor $Q_1$.

Figure 13:
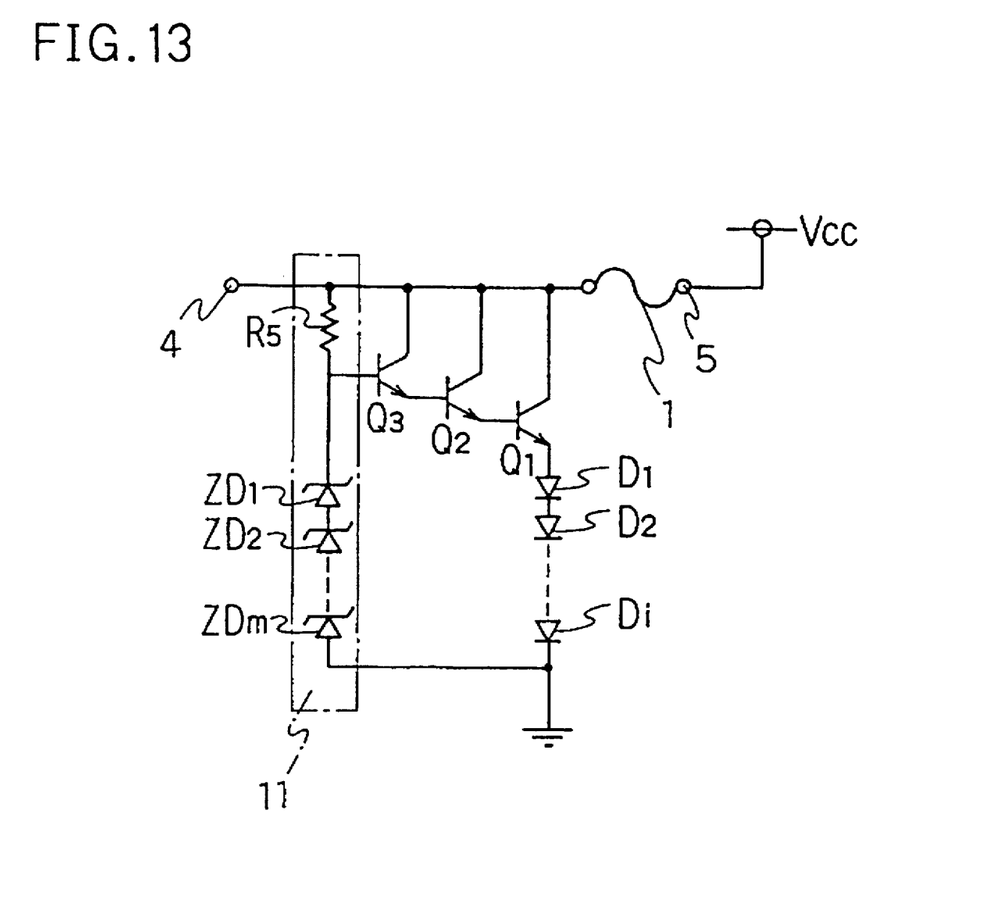
FIG. 13 is an equivalent circuit diagram showing a tenth embodiment of a semiconductor protection circuit according to the present invention.

FIG. 13 is an equivalent circuit diagram showing a tenth embodiment of a semiconductor protection circuit of the present invention. In this embodiment, three transistors $Q_1$, $Q_2$ and $Q_3$ are connected in the Darlington fashion as a sensor transistor so that amplification is performed in multiple stages by a plurality of transistors, allowing a larger amount of current to flow when the three transistors $Q_1$, $Q_2$ and $Q_3$ are turned on. Consequently, even if a load requires a large amount of current, that is, if the current fuse 1 needs to be one for a high current rate, the current fuse can be blown accurately.

In this embodiment, a number m of Zener diodes $ZD_1$, $ZD_2, \ldots ZD_m$ are used to raise a voltage applied as a bias voltage between the base of the transistor $Q_3$ and the diode $D_i$ that is the final one of the forward diodes $D_1, \ldots D_i$ connected in series to the emitter of the output stage transistor $Q_1$ in a Darlington connection. However, the use of a plurality of Zener diodes has no particular relation with the use of transistors connected in the Darlington fashion, each being adopted because of its own merits. According as a number m of Zener diodes are used, it is necessary to connect a number i of diodes in series to the emitter in order to obtain a higher forward voltage according to a higher bias voltage, and this leads to an enhancement of the sensitivity to temperature, as described above.

This embodiment, where a plurality of transistors are connected in the Darlington fashion, is effective, for example, when a load requires a large current, because, in such a case, the fuse 1 must have a current capacity large enough to allow a large current flow at the output terminal 4, and in order to obtain a current sufficient for blowing such a fuse, a large amplification factor $h_{FE}$ is required.

Figure 14:
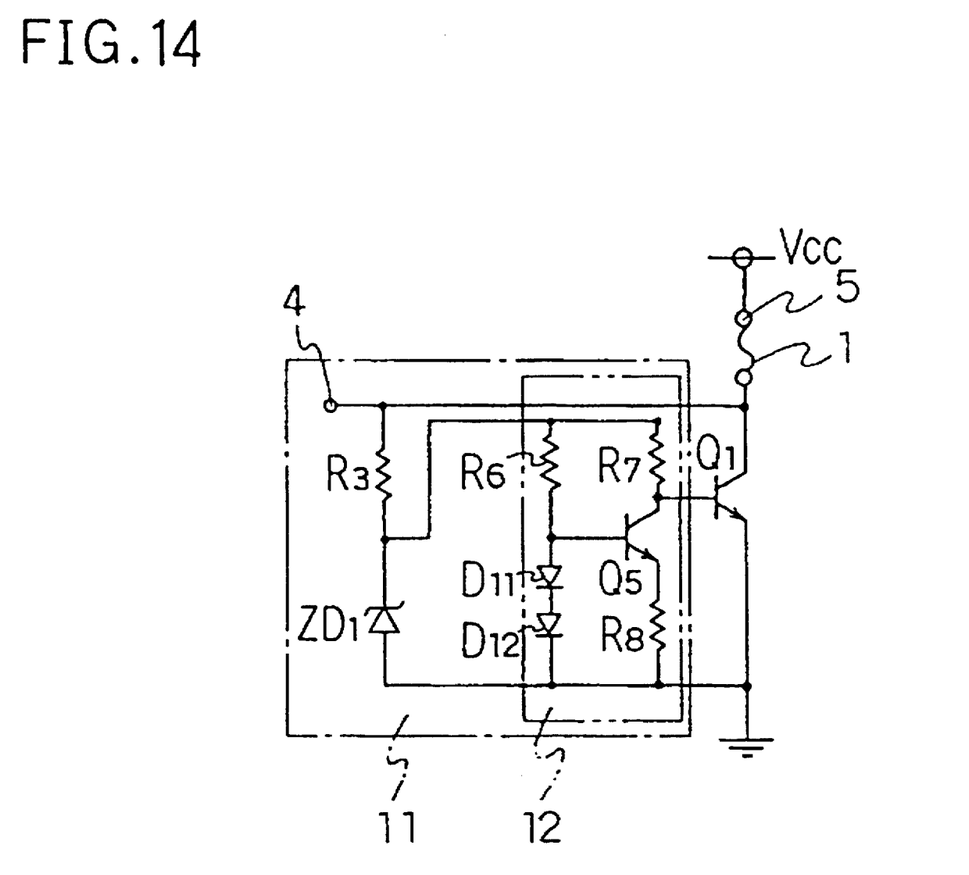
FIG. 14 is an equivalent circuit diagram showing a eleventh embodiment of a semiconductor protection circuit according to the present invention.

FIG. 14 is an equivalent circuit diagram showing an eleventh embodiment of a semiconductor protection circuit of the present invention. In this embodiment, the bias circuit 11 comprises a constant voltage source realized by use of a Zener diode $ZD_1$, for example, and a current mirror constant voltage setting circuit connected parallel with said constant voltage source. The bias circuit 11 applies a stepped-down voltage appearing at the output stage of the current mirror constant voltage supply circuit as a bias voltage between the base and the emitter of the sensor transistor $Q_1$. As a result, the sensor transistor $Q_1$ can be turned on sharply. The current mirror constant voltage setting circuit 12 is constructed as a current mirror circuit comprising, for example, two diodes $D_{11}$ and $D_{12}$, a transistor $Q_5$, a resistor $R_8$, and resistors $R_6$ and $R_7$ connected to the aforementioned components, as shown in FIG. 14. The output stage transistor $Q_5$ of the current mirror circuit applies a bias voltage to the base of said sensor transistor $Q_1$. Other portions of this embodiment are the same as in embodiments described above.

As to how the transistor $Q_1$ is sharply turned on and how a voltage is stepped down, a detailed description of the workings of the current mirror constant voltage setting circuit 12 of the present invention will be given below.

In a bias circuit as shown in FIG. 4, for example, when a rise in the ambient temperature causes a current to flow through a sensor transistor $Q_1$, the current $I_{R2}$ flowing through a resistor $R_2$ is a current ($I_{R2}=I_{R1}-I_B$) determined by subtracting a current $I_B$ flowing into the base of the transistor $Q_1$ from a current $I_{R1}$ flowing through a resistor $R_1$. Thus, a voltage $V_B$ at the base drops, slowing down the rising of the sensor transistor $Q_1$. In the present circuit, however, a diode $D_{11}$ and a transistor $Q_5$ constitute a current mirror circuit. As a result, even if the ambient temperature rises, the forward voltages of the diode $D_{11}$ and the transistor $Q_5$ drop at the same rate, compensating each other for forward voltage variations due to a temperature variation. In addition, a voltage across a resistor $R_8$ is fixed to a forward voltage $V_{fD12}$ of a diode $D_{12}$. Accordingly, a current $I_{R8}$ flowing through a resistor $R_8$ is determined by an expression $I_{R8}=V_{fD12}/R_8$. At a normal environment temperature, at which no current flows into the sensor transistor $Q_1$, a current $I_{R8}$ flowing through the resistor $R_8$ is substantially equal to a current $I_{R7}$ flowing through a resistor $R_7$, and thus a voltage across the resistor $R_7$ is determined as $V_{R7}=R_7 \cdot I_{R7} \approx R_7 \cdot I_{R8} = R_7 \cdot V_{fD12}/R_8$. This means that, as the ambient temperature rises, $V_{fD12}$ and $V_{R7}$ drop. In other words, since a voltage $V_B$ at a point B connected to the base of the sensor transistor $Q_1$ rises, the sensor transistor can be turned on more easily.

On the other hand, the bias voltage $V_B$ for the sensor transistor $Q_1$ is determined by subtracting a voltage $V_{R7}$ across the resistor $R_7$ from a constant voltage $V_{BG}$ across a constant voltage source (ZD$_1$), that is, $V_B=V_{BG}-V_{R7}=V_{BG}-V_{fD12} \cdot R_7/R_8$. In other words, since the bias voltage $V_B$ depends on a value of $R_7/R_8$, it can freely be stepped down to a desired voltage by adjusting a resistance ratio $R_7/R_8$. Thus, it is possible to adapt the bias voltage $V_B$ to a temperature setting by adjusting the bias voltage $V_B$ to a voltage slightly lower than a base-emitter forward voltage of the sensor transistor $Q_1$ (or a sum of forward voltages of diodes connected in series to the emitter).

According to this embodiment, since a current mirror constant voltage setting circuit is connected to a bias voltage output terminal of the bias circuit so that a bias voltage for the sensor transistor $Q_1$ is supplied from an output stage transistor in the current mirror constant voltage setting circuit, it is possible to fine-tune and to stabilize a current supplied to the base of the ambient temperature sensor transistor $Q_1$ or to the collector of the transistor $Q_5$ of the current mirror constant voltage setting circuit 12. In addition, since the operation temperature can be determined by the resistance ratio $R_7/R_8$, absolute deviations encountered in a production process have no practical effects, and therefore, only relative deviations need to be evaluated there.

Although this embodiment uses a current mirror circuit comprising a diode and a transistor, a typical current mirror circuit comprising two transistors can be used for the same purpose. Moreover, instead of a Zener diode used as a constant voltage circuit in FIG. 14, a Widlar circuit (band-gap circuit), a Schottky diode or other can be used for Generating a constant voltage to be supplied to said current mirror constant voltage setting circuit.

Figure 15A:
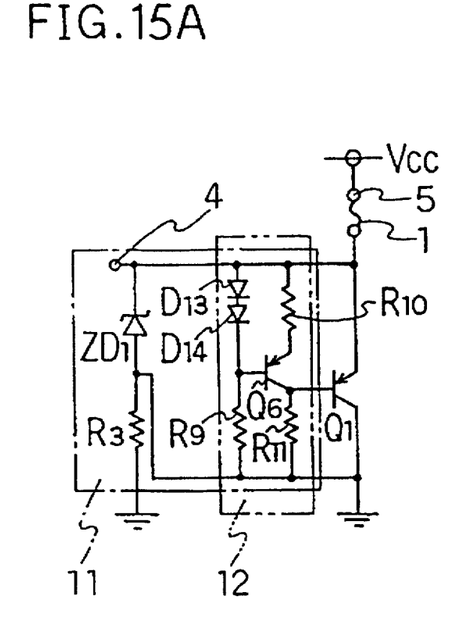
FIG. 15A and 15B are equivalent circuit diagrams showing a twelfth and thirteenth embodiments, respectively, of a semiconductor protection circuit according to the present invention.
Figure 15B:
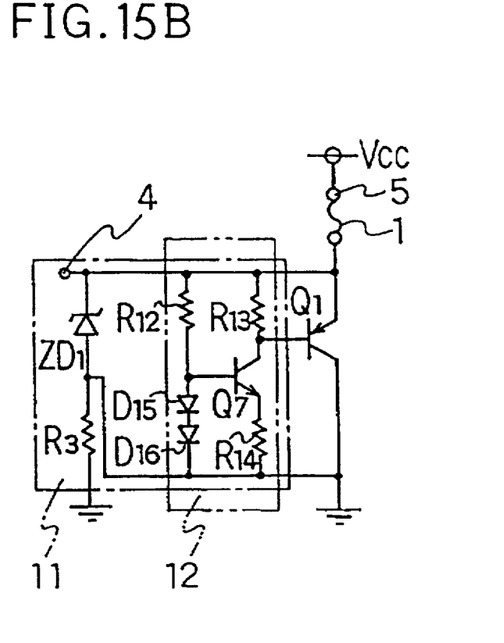

FIGS. 15A and 15B are equivalent circuit diagrams showing twelfth and thirteenth embodiments of a semiconductor protection circuit of the present invention. In these embodiments, a pnp transistor is used as the transistor $Q_1$ that serves as an ambient temperature sensor, and the bias circuit 11 uses a current mirror constant voltage setting circuit 12 as in the eleventh embodiment. FIG. 15A shows an embodiment where a pnp transistor is used as the transistor $Q_6$ of the current mirror constant voltage setting circuit 12. FIG. 15B shows an embodiment where an npn transistor is used as the transistor $Q_7$ of the current mirror constant voltage setting circuit.

In these embodiments, the transistor $Q_1$ has its emitter connected to the current fuse 1 and its collector connected to a ground. In FIG. 15A, a voltage obtained by subtracting a voltage across the resistor $R_{11}$ from the power voltage $V_{cc}$ is applied as a bias voltage. In FIG. 15B, a voltage across the resistor $R_{13}$ is applied as a bias voltage.

Use of a pnp transistor in these embodiments has an advantage of reducing power consumption.

Although these embodiments use a current mirror constant voltage setting circuit 12 parallel with a constant voltage source in the bias circuit 11, the driver circuit 11 may be constructed in the same way as in the tenth and eleventh embodiments described above, even if a pnp transistor is used as the sensor transistor $Q_1$.

Figure 17:
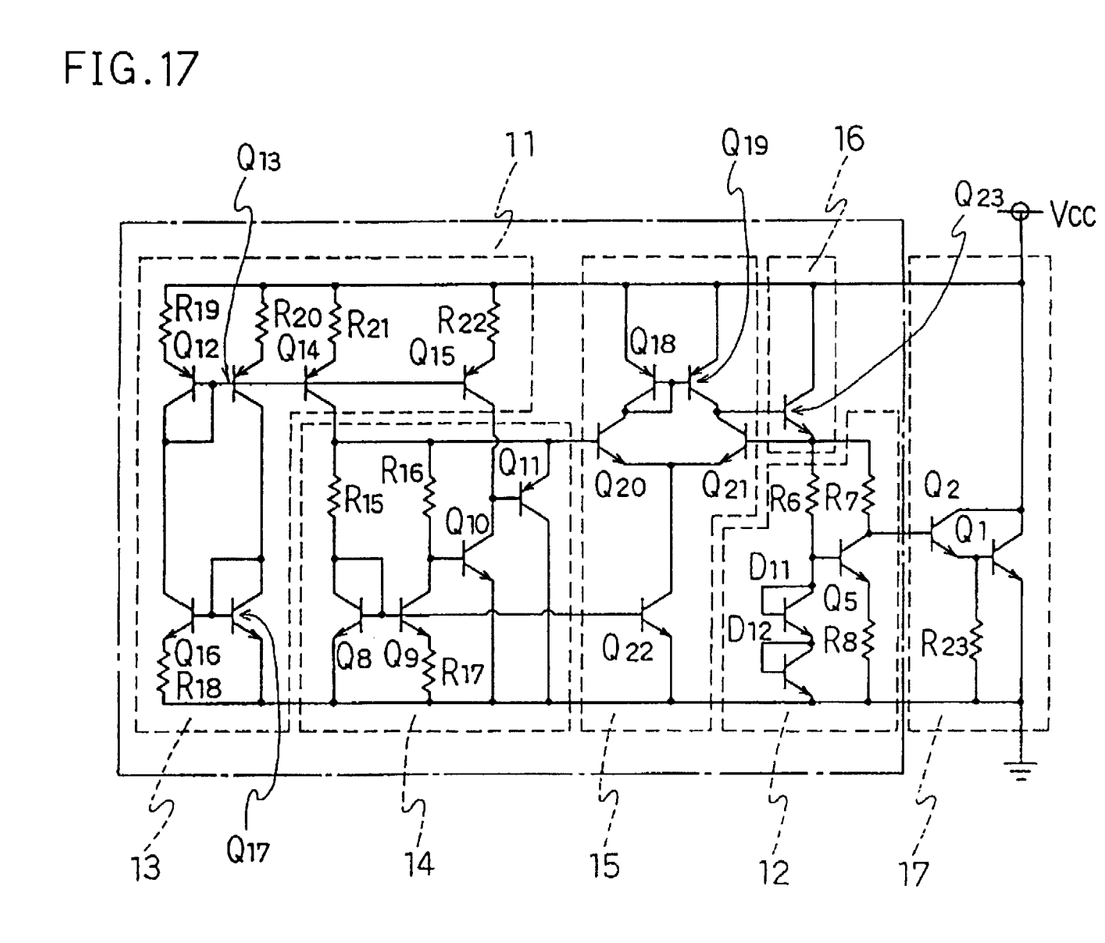
FIG. 17 is an equivalent circuit diagram showing a fourteenth embodiment of a semiconductor protection circuit according to the present invention.
Figure 18:
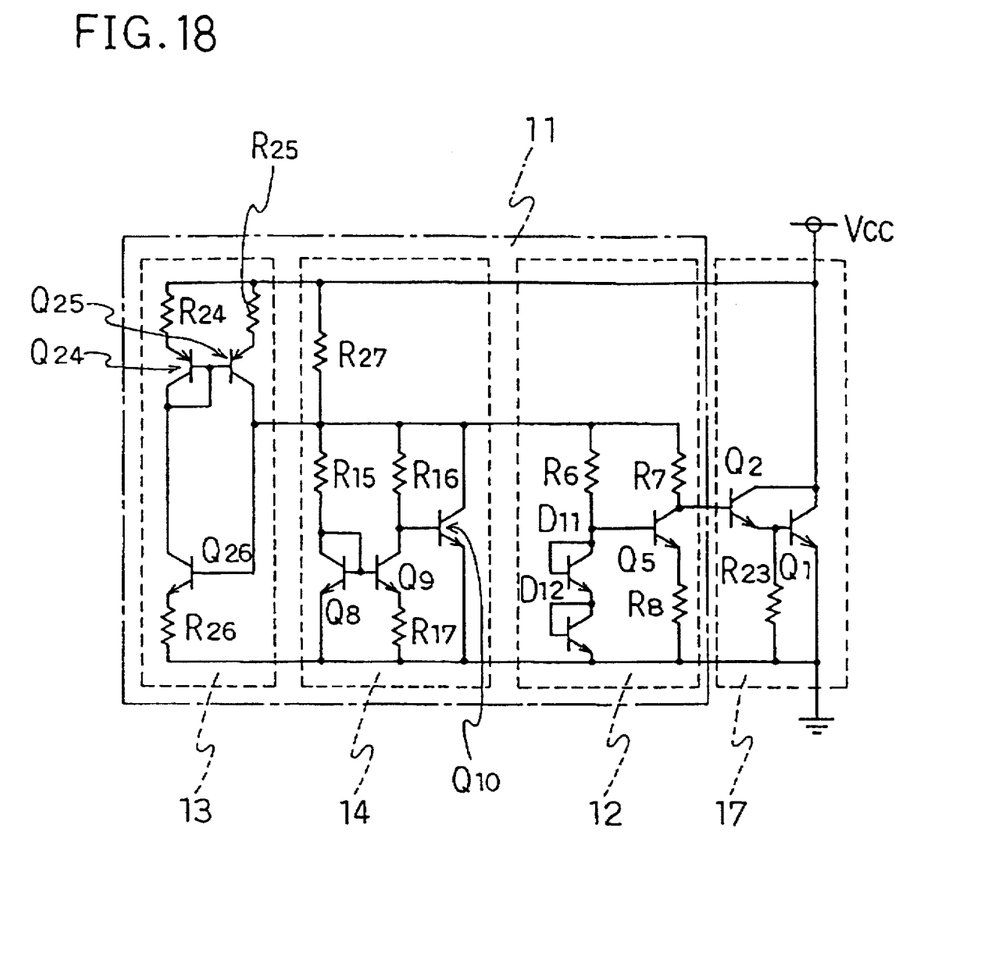
FIG. 18 is an equivalent circuit diagram showing a fifteenth embodiment of a semiconductor protection circuit according to the present invention.

FIG. 17 and 18 are equivalent circuit diagrams showing fourteenth and fifteenth embodiments of a semiconductor protection circuit of the present invention. In these embodiments, a Widlar circuit (band-gap circuit) is used to generate a constant voltage to be supplied as a bias voltage to the sensor transistor $Q_1$. A Widlar circuit (band-gap circuit) is a circuit that uses band gap energy of a semiconductor to maintain a constant voltage, and that is realized with a current mirror circuit in which a current through one of its two current paths is adjusted with a resistor.

A constant voltage source of these embodiments can provide a constant voltage lower than a Zener voltage. A Zener voltage is usually around 7 V, if generated as an emitter-base threshold voltage of an npn transistor commonly used in IC's. Therefore, a power source voltage $V_{cc}$ needs to be higher than 7V, as long as a Zener diode is used. Considering recent electronic devices such as a microcomputer are preferably driven at a low voltage, namely, at 5V or 3V, use of a Zener voltage of around 7V as a constant voltage does not comply with a trend toward low-voltage drive. The constructions of these embodiments provide a solution to this problem.

Figure 16:
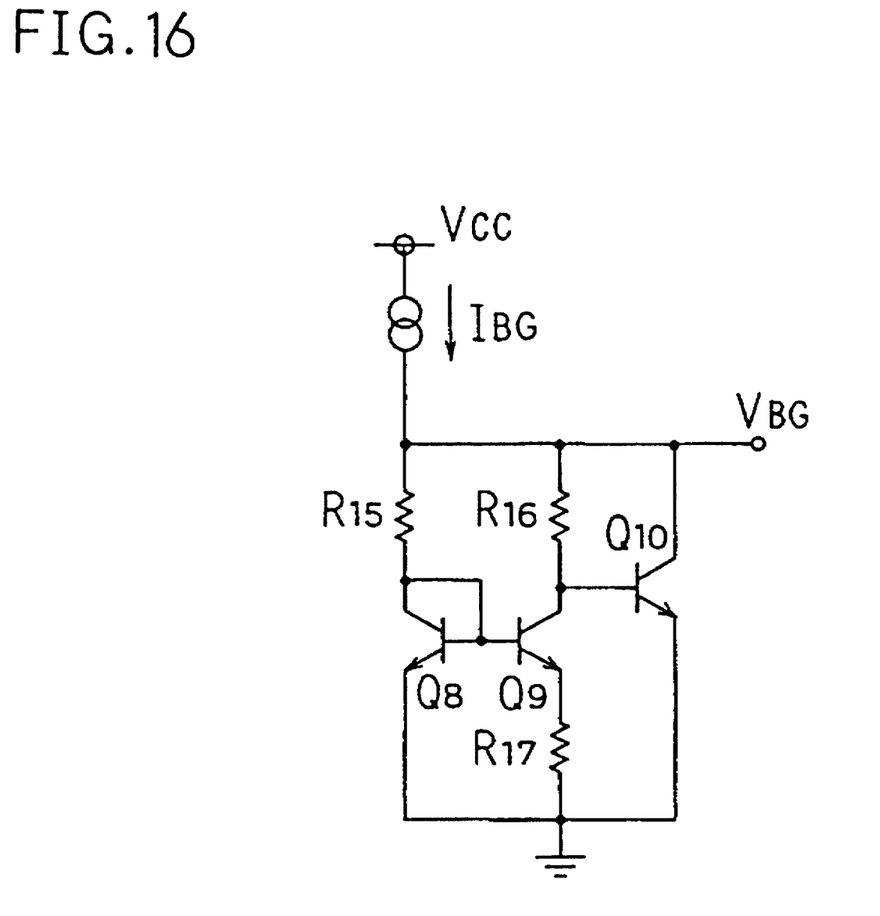
FIG. 16 is a circuit diagram showing a basic construction of a constant voltage circuit which is employed in the present invention.

FIG. 16 is a circuit diagram showing a basic construction of a constant voltage circuit of these embodiments. In FIG. 16, a current mirror circuit comprises transistors $Q_8$ and $Q_9$, which are different from each other in area size, and which are connected through resistors $R_{15}$ and $R_{16}$, respectively, to a constant current circuit that supplies a constant current $I_{BG}$. A resistor $R_{17}$ is connected to the emitter of the transistor $Q_9$ in order to form a Widlar circuit in which a current through one of the circuit's two current paths should be adjusted. In addition, a transistor $Q_{10}$ is connected to that current path. A sum of a voltage across the resistor $R_{16}$ and a base-emitter forward voltage (approximately 0.7V) of the transistor $Q_{10}$ is outputted as a band-gap voltage $V_{BG}$. Since this construction uses a band-gap voltage as a reference voltage, it can supply a constant voltage that is not affected by a temperature variation.

FIG. 17 is an equivalent circuit diagram showing a semiconductor protection circuit of the present invention, in which a band-gap circuit is used. In FIG. 17, reference numeral 11 is a bias circuit comprising a constant voltage source and the current mirror constant voltage setting circuit 12. The constant voltage source has a constant current circuit 13, a band-gap constant voltage circuit 14, a buffer circuit 15 and a driver current circuit 16. A constant bias voltage is supplied to the base of the sensor transistor $Q_2$ (actually, two npn transistors $Q_1$ and $Q_2$ are connected in the Darlington fashion in this embodiment) in a sensor portion 17.

The constant current circuit 13 comprises transistors $Q_{12}$, $Q_{13}$, $Q_{14}$ and $Q_{15}$ which form a current mirror circuit, and transistors $Q_{16}$, $Q_{17}$ and a resistor $R_{18}$ which form a Widlar circuit. Resistors $R_{19}$, $R_{20}$, $R_{21}$ and $R_{22}$ connected to the power supply side of transistors $Q_{12}$, $Q_{13}$, $Q_{14}$ and $Q_{15}$ serve for suppressing Early effects in these transistors.

A band-gap constant voltage circuit 14 is the same as the constant voltage circuit shown in FIG. 16 as a basic construction, and therefore, its same components of FIG. 16 are identified by the same designations. Here, however, a pnp transistor $Q_{11}$ is added in the output stage in order to maintain a constant output voltage even when a large current flows. This is because the output voltage tends to drop more according as the current flowing at the output grows larger. Therefore, use of the transistor $Q_{11}$ is preferable for stabilizing the output voltage, though not absolutely necessary.

A buffer circuit 15 prevents deterioration of the rising characteristic of the sensor portion when a large current flows in the sensor portion. In other words, the buffer circuit 15 keeps an input current constant even if the sensor portion is turned on, receiving a large current. As shown in FIG. 17, for example, it is constructed as a single-end differential amplifier comprising transistors $Q_{18}$, $Q_{19}$, $Q_{20}$, $Q_{21}$ and $Q_{22}$. The buffer circuit 15 has a driver current circuit 16 comprising a current supply transistor $Q_{23}$ at its output stage in order to cope with a large current flow in the sensor portion.

The output portion of the buffer circuit 15 is connected through the driver current circuit 16 to a current mirror constant voltage setting circuit 12 as described in embodiments 11 to 13 above, in order to supply a constant voltage to the base of the transistor $Q_2$ of the sensor portion. The current mirror constant voltage setting circuit 12 serves, as described above, for maintaining a sharp rising characteristic even when the transistors $Q_1$ and $Q_2$ of the sensor portion 17 are turned on inciting a current to flow, and for stepping down a constant voltage into a voltage slightly lower than the forward voltages of the transistor $Q_1$ and $Q_2$ of the sensor portion 17.

Use of the buffer circuit 14, the driver current circuit 16 and the current mirror constant voltage setting circuit is preferable for a constant supply of a stable voltage, though not absolutely necessary.

FIG. 18 is an equivalent circuit diagram showing a semiconductor protection circuit of the present invention, in which a constant voltage source supplies a voltage lower than a Zener voltage. In this embodiment, the constant current circuit is simplified, while the band-gap constant voltage circuit 14 and the current mirror constant voltage setting circuit 12 are the same as in FIG. 17. Moreover, although the buffer circuit is omitted in FIG. 18, it may be inserted between the band-gap constant voltage circuit 14 and the current mirror constant voltage setting circuit 12 just as in FIG. 17, so that a stable voltage is obtained even when a large current flows in the sensor portion 17.

In the constant current circuit of this embodiment, a current mirror circuit comprises two transistors $Q_{24}$ and $Q_{25}$ and resistors $R_{24}$ and $R_{25}$, a transistor forming a Widlar circuit comprises a transistor $Q_{26}$ and a resistor $R_{26}$, and both the constant current circuit and the constant voltage circuit uses the same Widlar circuit (band-gap circuit). Also by this construction, a stable constant voltage can be obtained, because a band gap in the constant voltage circuit is used as a reference voltage for generating a constant current. As a result, it is possible to reduce the number of circuit elements, thereby reducing the chip size, and improving chip yields.

According to the present invention, a semiconductor protection circuit is composed of a current fuse and a transistor connected in series, and, utilizing a temperature characteristic of the forward voltage of a p-n junction in a transistor, it makes the transistor conduct a current, in the event of overheat, so that the current fuse is blown. Consequently, in the event of overheat in a load, the semiconductor protection circuit completely shut off the supply of power to the load, and therefore, it allows examination and removal of causes of a fault as well as replacement of the semiconductor protection circuit to be done before restarting the supply of power, thus preventing repetition of the same fault which may lead to a complete destruction of the load.

Further, in a semiconductor protection circuit according to the present invention, since a transistor and a bias circuit is formed as an integrated circuit on a semiconductor substrate into a small semiconductor chip, and in addition, a current fuse is connected between leads when resin-molded together with the semiconductor chip, the whole circuit can be formed as a low-cost, compactly-packaged three-terminal ($V_{cc}$, GND and OUT) device, which is fit for a variety of applications.

Moreover, the present invention utilizes the temperature characteristic of the forward voltage of a p-n junction to achieve an accurate control of operation temperature, which is more accurate than is achieved with a more expensive thermal fuse. In addition, by connecting a plurality of p-n junctions in series, it can further enhance sensitivity to temperature, which leads to a more accurate control.

Further, according to the present invention, a semiconductor protection circuit offers, not only a protection against overheat, but also a protection against overcurrent prior to a rise in temperature, thus providing a more effective protection to a load.

What is claimed is:

1. A semiconductor protection circuit, comprising a power supply terminal;

a current fuse, of which one end is connected to said power supply terminal;

a transistor connected between other end of said current fuse and a ground;

an output terminal connected to a connection between the other terminal of said current fuse and said transistor; and a bias circuit for applying a constant bias voltage between a base and an emitter of said transistor, said constant bias voltage being lower than a normal environment temperature forward voltage of a p-n junction between said base and said emitter.

2. A semiconductor protection circuit as claimed in claim 1, wherein said bias circuit includes at least two resistors connected in series across a constant voltage, a voltage divided by said resistors being applied as said bias voltage.

3. A semiconductor protection circuit as claimed in claim 1,
wherein said bias circuit includes a resistor and a Zener diode connected in series between said power supply terminal and said ground, a Zener voltage of said Zener diode being applied as said bias voltage.

4. A semiconductor protection circuit as claimed in claim 3,
wherein a plurality of said Zener diodes are connected in series.

5. A semiconductor protection circuit as claimed in claim 1,
wherein said bias circuit includes a current mirror circuit, said bias voltage being obtained by an output stage of said current mirror circuit.

6. A semiconductor protection circuit as claimed in claim 1,
wherein said transistor includes a plurality of transistor connected in the Darlington fashion.

7. A semiconductor protection circuit as claimed in claim 1,
wherein said bias circuit is provided with a constant voltage source for supplying said constant bias voltage, and a current mirror constant voltage setting circuit is provided parallel with said constant voltage source, and a constant voltage stepped down by an output stage of said current mirror constant voltage setting circuit is outputted as said bias voltage.

8. A semiconductor protection circuit as claimed in claim 1,
wherein said bias circuit is provided with a constant voltage source for supplying said constant bias voltage, said constant voltage source comprising a constant current circuit and a constant voltage circuit utilizing a Widlar circuit.

9. A semiconductor protection circuit as claimed in claim 8,
wherein said constant current circuit utilizes a Widlar circuit.

10. A semiconductor protection circuit as claimed in claim 8,
wherein a buffer circuit is provided at the output stage of said constant voltage circuit, said buffer circuit maintaining a constant current on the bias voltage side even if said transistor is turned on allowing a current to flow.

11. A semiconductor protection circuit, comprising
a power supply terminal;
a current fuse, of which one end is connected to said power supply terminal;
a transistor connected between other end of said current fuse and a ground;
a forward diode connected between an emitter of said transistor and the Ground;
a bias circuit for applying a constant bias voltage between a base of said transistor and a ground-side terminal of said diode, said constant bias voltage being lower than a sum of normal environment temperature forward voltages of p-n junctions in said transistor, between its base and emitter, and in said diode; and
an output terminal connected to a connection between other terminal of said current fuse and said transistor.

12. A semiconductor protection circuit as claimed in claim 11,
wherein a plurality of said forward diodes are connected.

13. A semiconductor protection circuit as claimed in claim 11,
wherein said bias circuit includes at least two resistors connected in series across a constant voltage, a voltage divided by said resistors being applied as said bias voltage.

14. A semiconductor protection circuit as claimed in claim 11,
wherein said bias circuit includes a resistor and a Zener diode connected in series between said power supply terminal and said ground, a Zener voltage of said Zener diode being applied as said bias voltage.

15. A semiconductor protection circuit as claimed in claim 11,
wherein said bias circuit includes a current mirror circuit, said bias voltage being obtained by an output stage of in said current mirror circuit.

16. A semiconductor protection circuit as claimed in claim 11,
wherein said transistor includes a plurality of transistor connected in the Darlington fashion.

17. A semiconductor protection circuit as claimed in claim 11,
wherein said bias circuit is provided with a constant voltage source for supplying said constant bias voltage, and a current mirror constant voltage setting circuit is provided parallel with said constant voltage source, and a constant voltage stepped down by an output stage of said current mirror constant voltage setting circuit is outputted as said bias voltage.

18. A semiconductor protection circuit as claimed in claim 11,
wherein said bias circuit is provided with a constant voltage source for supplying said constant bias voltage, said constant voltage source comprising a constant current circuit and a constant voltage circuit utilizing a Widlar circuit.

19. A semiconductor protection circuit as claimed in claim 18,
wherein said constant current circuit utilizes a Widlar circuit.

20. A semiconductor protection circuit as claimed in claim 18,
wherein a buffer circuit is provided at the output stage of said constant voltage circuit, said buffer circuit maintaining a constant current on the bias voltage side even if said transistor is turned on allowing a current to flow.

* * * * *